(12) United States Patent
Kellerman et al.

(10) Patent No.: US 7,800,082 B2
(45) Date of Patent: Sep. 21, 2010

(54) ELECTROMAGNET WITH ACTIVE FIELD CONTAINMENT

(75) Inventors: Peter L. Kellerman, Essex, MA (US); Keneth H. Purser, Lexington, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 241 days.

(21) Appl. No.: 11/276,128

(22) Filed: Feb. 15, 2006

(65) Prior Publication Data

US 2007/0187619 A1    Aug. 16, 2007

(51) Int. Cl.
*H01J 37/317* (2006.01)
(52) U.S. Cl. ............ 250/492.21; 250/251; 250/396 ML
(58) Field of Classification Search ............. 250/492.21
See application file for complete search history.

(56) References Cited

U.S. PATENT DOCUMENTS

| | | | |
|---|---|---|---|
| 5,576,538 A * | 11/1996 | Sakai et al. ................. | 250/251 |
| 6,160,262 A | 12/2000 | Aoki et al. | |
| 6,289,681 B1 * | 9/2001 | Eckels et al. ................. | 62/47.1 |
| 6,403,967 B1 | 6/2002 | Chen et al. | |
| 6,770,888 B1 | 8/2004 | Benveniste et al. | |
| 6,794,661 B2 * | 9/2004 | Tsukihara et al. ...... | 250/492.21 |
| 6,835,930 B2 | 12/2004 | Benveniste et al. | |
| 2002/0050569 A1 * | 5/2002 | Berrian ................. | 250/396 ML |
| 2005/0258380 A1 * | 11/2005 | White et al. ........... | 250/492.21 |
| 2006/0017010 A1 * | 1/2006 | Vanderberg et al. ...... | 250/492.1 |

FOREIGN PATENT DOCUMENTS

EP    0926699 A1    6/1999

* cited by examiner

*Primary Examiner*—David A. Vanore
*Assistant Examiner*—Phillip A. Johnston (57) ABSTRACT

An electromagnet and related ion implanter system including active field containment are disclosed. The electromagnet provides a dipole magnetic field within a tall, large gap with minimum distortion and degradation of strength. In one embodiment, an electromagnet for modifying an ion beam includes: a ferromagnetic box structure including six sides; an opening in each of a first side and a second opposing side of the ferromagnetic box structure for passage of the ion beam therethrough; and a plurality of current-carrying wires having a path along an inner surface of the ferromagnetic box structure, the inner surface including the first side and the second opposing side and a third side and a fourth opposing side, wherein the plurality of current-carrying wires are positioned to pass around each of the openings of the first and second opposing sides.

25 Claims, 12 Drawing Sheets

ELECTROMAGNET WITH ACTIVE FIELD CONTAINMENT

BACKGROUND OF THE INVENTION

1. Technical Field

The invention relates generally to ion implantation, and more particularly, to an electromagnet with active field containment for modifying an ion beam.

2. Background Art

Ion implanters are commonly used in the production of semiconductor wafers. An ion beam implanter system generates an ion beam of charged ions which, when applied to a surface of a semiconductor wafer, are implanted or "doped" onto the wafer surface. In ion implanters, wide beams, e.g., greater than approximately 30 cm wide, have become commonplace. Wide ion beams are advantageous for two reasons: to mitigate space charge in the transport of low energy, high current beams, and in order to provide an ion beam suitable for single wafer implantation.

Prior to implanting, filtering high energy neutral particles (also referred to as energy contaminants) is some times required. This filtering step is typically provided by bending the ion beam using either an electrostatic deflection or magnetic deflection. Relative to the latter process, dipole magnetic fields are commonly used to filter energy contaminants. In addition, dipole magnetic fields are also used to mass analyze the ion beam upstream from the filtering step.

One challenge relative to wide ion beams is to provide a uniform dipole magnetic field that can bend a wide ion beam in a plane perpendicular to the ribbon, while not adding significant length to the ion implanter system, introducing aberrations in the ion beam or adding large stray magnetic fields. Stray magnetic fields are deleterious because they affect operation of ion implanter components before and after the dipole magnetic field. For high current, low energy ion beams, it is also desirable to enhance plasma neutralization by the addition of multi-cusp permanent magnets. However, these multi-cusp magnets can perturb the ion beam if they are too close to the ion beam, thus making it desirable to have a tall beam line, which then necessitates a tall magnet. It is especially important that the fringing fields drop to zero rapidly when the magnet is close to the wafer (as is the case in an energy contamination filter), since fringing fields from the magnet can have a deleterious effect on charge neutralization at the wafer.

Figure 1:
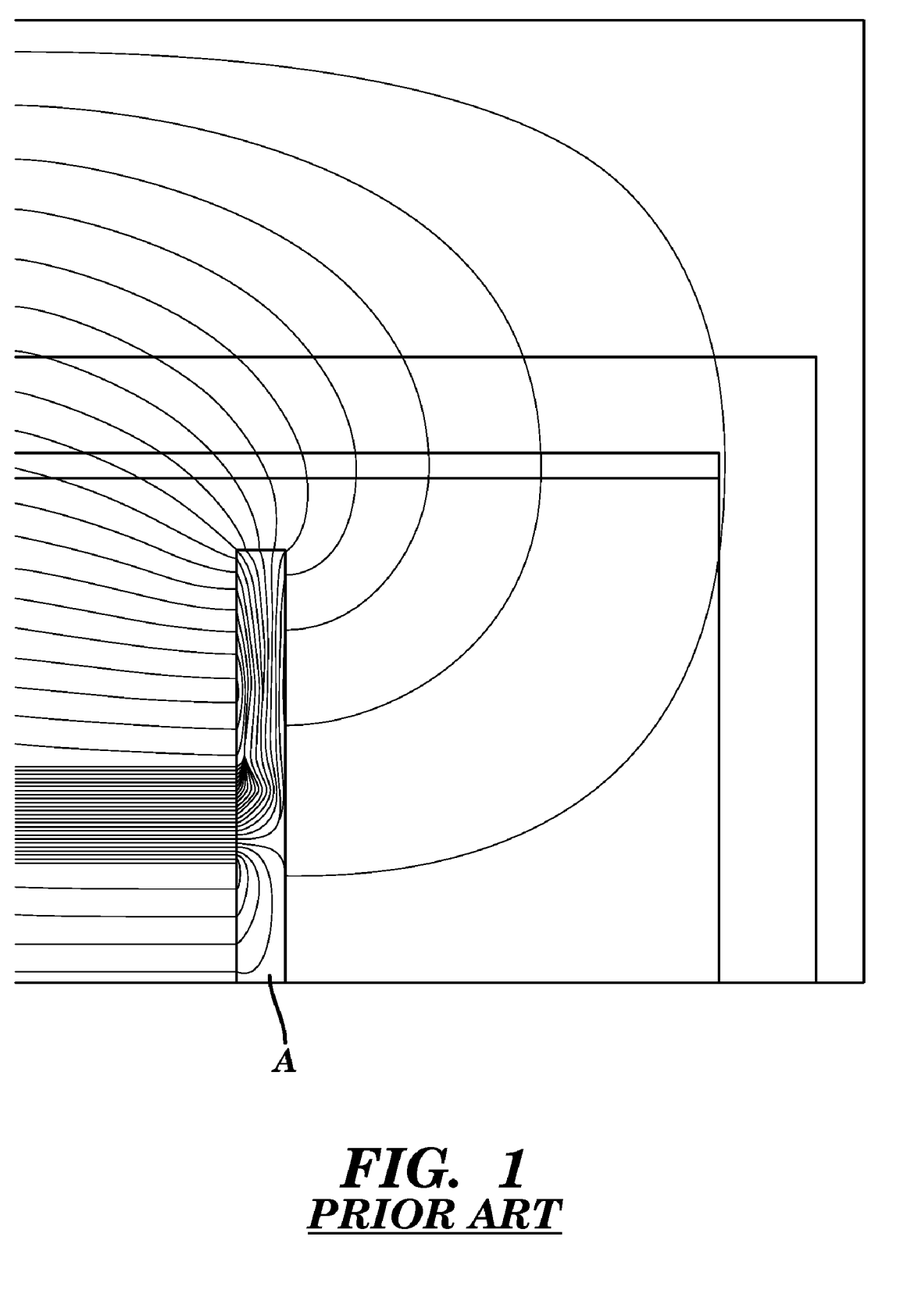
FIG. 1 shows a portion of an example of a wide gap dipole permanent magnet with no magnetic field clamping.
Figure 2:
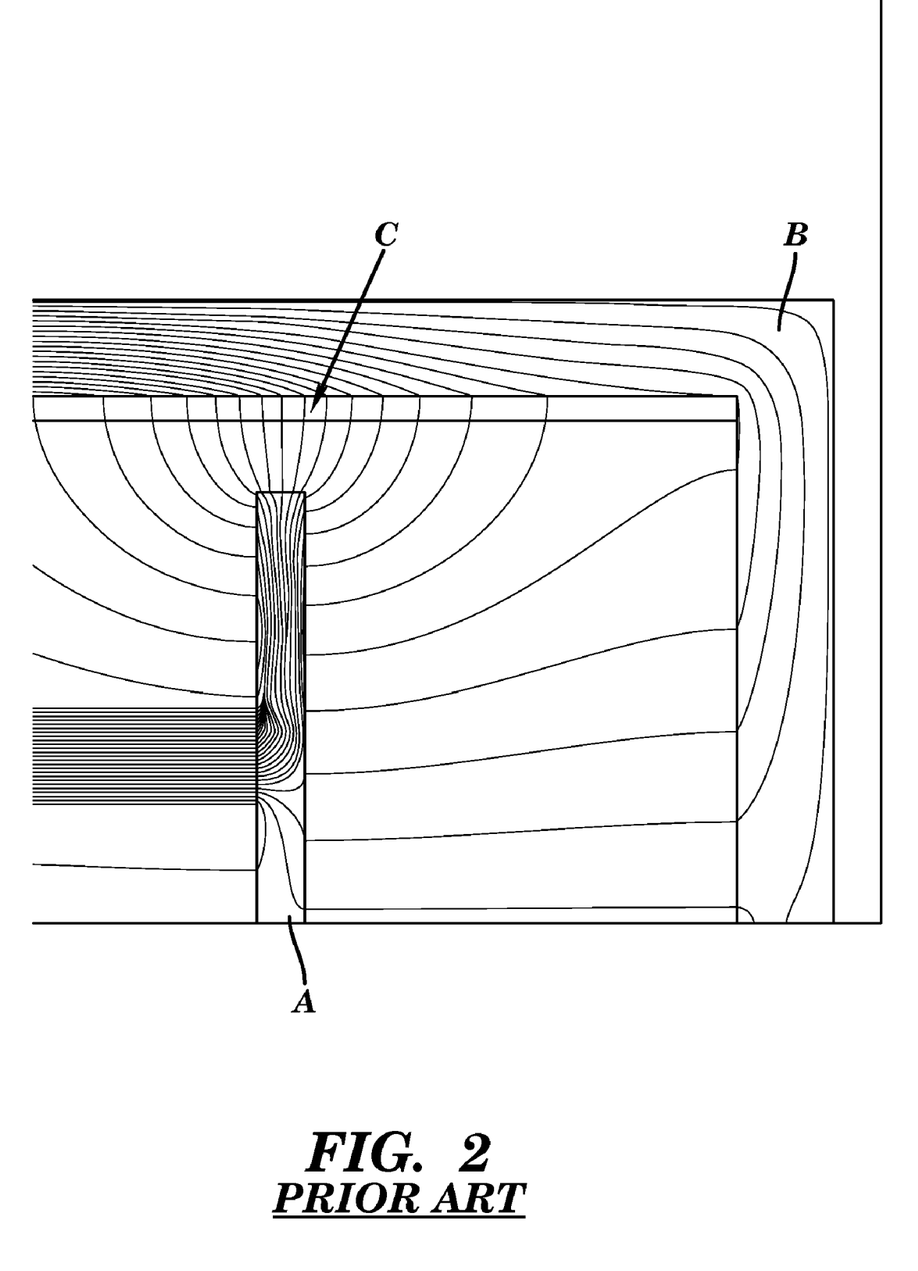
FIG. 2 shows the portion of the magnet of FIG. 1 with steel added to clamp the magnetic field.

Clamping the magnetic fields, without introducing large aberrations in the ion beam, presents a challenge in designing a tall dipole magnet for a wide ion beam. Conventionally, steel has been used to passively clamp the fields of a large gap dipole magnet such that the fields are perpendicular to the steel surface. In addition, the steel provides a low reluctance path to the magnetic flux. Unfortunately, this approach severely degrades both the quality and magnitude of the field within the magnet. In particular, this approach severely distorts the original dipole field, which was parallel to the direction of the steel surface, and the flux being shunted through the clamp, thereby reducing the field magnitude within the magnet. For example, FIG. 1 shows a portion of one illustrative wide gap dipole permanent magnet A with no field clamping, and FIG. 2 shows the same magnet A with steel B added to clamp the field. FIG. 2 also illustrates the above-mentioned field distortion C and dipole field reduction. It is desirable to have a way to contain the dipole magnetic field without enforcing a perpendicular boundary condition on it as in the conventional steel approach.

In view of the foregoing, there is a need in the art for an electromagnet for modifying an ion beam with active field containment.

SUMMARY OF THE INVENTION

An electromagnet and related ion implanter system including active field containment are disclosed. The electromagnet provides a dipole magnetic field within a tall, large gap with minimum distortion and degradation of strength. In one embodiment, an electromagnet for modifying an ion beam includes: a ferromagnetic box structure including six sides; an opening in each of a first side and a second opposing side of the ferromagnetic box structure for passage of the ion beam therethrough; and a plurality of current-carrying wires having a path along an inner surface of the ferromagnetic box structure, the inner surface including the first side and the second opposing side and a third side and a fourth opposing side, wherein the plurality of current-carrying wires are positioned to pass around each of the openings of the first and second opposing sides.

A first aspect of the invention provides an electromagnet for modifying an ion beam, the electromagnet comprising: a ferromagnetic box structure including six sides; an opening in each of a first side and a second opposing side of the ferromagnetic box structure for passage of the ion beam therethrough; and a plurality of current-carrying wires having a path along an inner surface of the ferromagnetic box structure, the inner surface including the first side and the second opposing side and a third side and a fourth opposing side, wherein the plurality of current-carrying wires are positioned to pass around each of the openings of the first and second opposing sides.

A second aspect of the invention provides an ion implanter system comprising: an ion beam generator; and an electromagnet including: a ferromagnetic box structure including six sides; an opening in each of a first side and a second opposing side of the ferromagnetic box structure for passage of the ion beam therethrough; and a plurality of current-carrying wires having a path along an inner surface of the ferromagnetic box structure, the inner surface including the first side and the second opposing side and a third side and a fourth opposing side, wherein the plurality of current-carrying wires are positioned to pass around each of the openings of the first and second opposing sides.

A third aspect of the invention provides an energy contamination filtering system for an ion implanter system, the energy contamination filtering system comprising: a ferromagnetic box structure including six sides; an opening in each of a first side and a second opposing side of the ferromagnetic box structure for passage of an ion beam therethrough; and a plurality of current-carrying wires having a path along an inner surface of the ferromagnetic box structure, the inner surface including the first side and the second opposing sides and a third side and a fourth opposing side, wherein the plurality of current-carrying wires are positioned to pass around each of the openings of the first and second opposing sides.

A fourth aspect of the invention provides a mass analysis magnet comprising: a ferromagnetic box structure including six sides; an opening in each of a first side and a second opposing side of the ferromagnetic box structure for passage of an ion beam therethrough; and a plurality of current-carrying wires having a path along an inner surface of the ferromagnetic box structure, the inner surface including the first side and the second opposing sides and a third side and a fourth opposing side, wherein the plurality of current-carrying wires are positioned to pass around each of the openings of the first and second opposing sides.

A fifth aspect of the invention provides a method of containing a magnetic field of a window-frame electromagnet, the method comprising the steps of: providing a plurality of current-carrying wires having a path along an inner surface of the window-frame electromagnet and around each window within a plane of each window; and communicating an electrical current along the plurality of current-carrying wires.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

The detailed description includes the following headings for organizational purposes only: I. Introduction, II. Illustrative Ion Implanter System, III. Electromagnet with Active Field Containment, IV. Applications, and V. Conclusion.

I. Introduction:

As indicated above, in one embodiment, the invention provides an electromagnet having active field containment, which is usable for modifying an ion beam in an ion implanter system. In an electromagnet used for modifying an ion beam, e.g., bend, focus, mass analysis, etc., it is desirable to have a way to contain the dipole magnetic field without enforcing a perpendicular boundary condition, as occurs with conventional steel field clamps. One theoretical approach to provide this active field containment is to introduce a region having zero magnetic permeability ($\mu=0$) instead of the high magnetic permeability of steel. This region would thus enforce a boundary condition tangential to the surface and would have no magnetic field inside the zero magnetic permeability region. The magnetic field, however, would not be zero outside the zero magnetic permeability region and, as a result, this region alone would not provide the active field containment property. One approach to address this situation is to back the zero magnetic permeability region with a high magnetic permeability (e.g., steel) region to obtain the desired effect of containing the dipole field within the electromagnet while retaining its direction parallel to the boundary, and also have zero magnetic field outside. The challenge relative to this approach, however, is how to implement such a condition when zero magnetic permeability materials only exist in the superconducting state (the Meisner effect). Furthermore, even at low temperature, this approach would only handle magnetic fields of less than approximately 100 G, and so would not provide a useful solution. In one embodiment of the invention, described herein, a region is implemented that mimics a superconducting slab by use of surface currents to provide active field containment for modifying an ion beam.

Figure 3A:
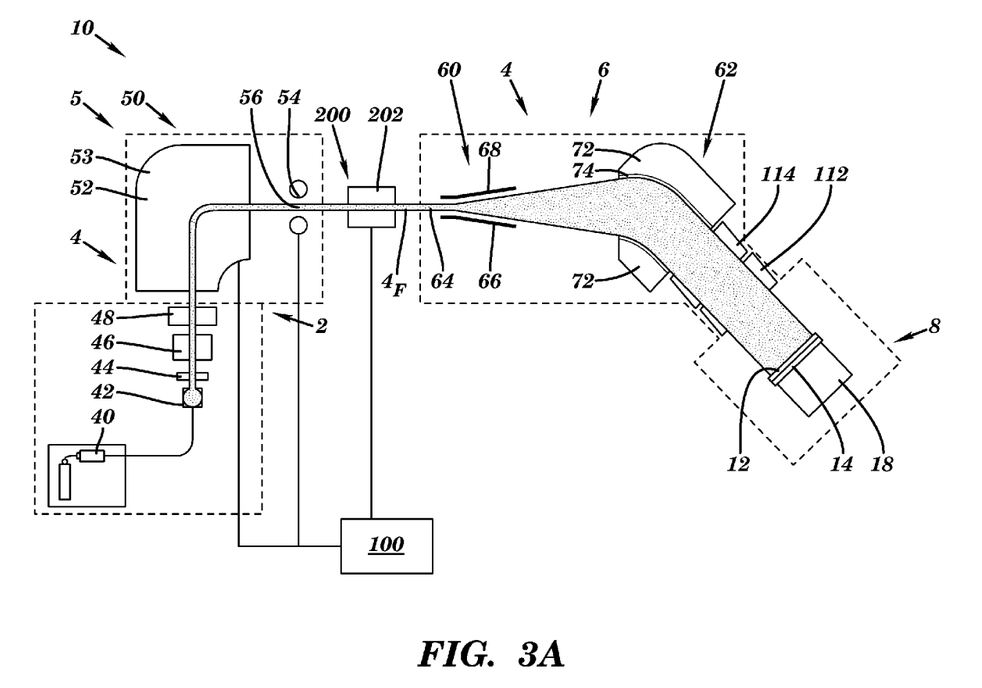
FIG. 3A shows a top view of an illustrative ion implanter system according to one embodiment of the invention.

II. Illustrative Ion Implanter System:

Referring to FIG. 3A, a top view of an illustrative ion implanter system 10 is shown. Ion implanter system 10 includes an ion beam generating sub-system 2 for generating and transmitting an ion beam 4, through ion beam filtering sub-system 5, ion beam scanning sub-system 6, to a target sub-system 8. Ion beam generating sub-system 2 may include any now known or later developed ion beam generator such as those available from Varian Semiconductor Equipment Associates. Typically, target sub-system 8 includes one or more semiconductor targets 12 (e.g., wafer) mounted to a platen 14. Characteristics of platen 14 and, hence, target 12, may be controlled by a platen drive assembly (not shown) that rotates target 12, i.e., wafer, and by a target vertical scan position controller 18 that controls the vertical position of target 12. Ion implanter system 10 may include additional components known to those skilled in the art. For example, target sub-system 8 typically includes an automated wafer handling equipment for introducing wafers into ion implanter system 10 and for removing wafers after implantation, a dose measurement device, an electron flood gun, etc. It will be understood that the entire path traversed by ion beam 4 is evacuated during an ion implantation.

Ion beam generating sub-system 2 may further include a gas flow 40, an ion beam source 42, an extraction manipulator 44, a filter magnet 46, and an acceleration/deceleration column 48. Filter magnet 46 is preferably positioned in close proximity to ion beam source 42. Extraction manipulator 44 is positioned between filter magnet 46 and ion beam source 42. Acceleration/deceleration column 48 is positioned between source filter 46 and a mass analyzer 50. Ion beam filtering sub-system 5 may include mass analyzer 50, which may include, for example, a dipole atomic mass unit (AMU) analyzing magnet 52 with a semicircle radius 53 and a mass resolving slit 54 having a resolving aperture 56.

Scanning sub-system 6 may include, for example, a scanner 60 and an angle corrector 62. Scanner 60, which may be an electrostatic scanner, deflects filtered ion beam to produce a scanned ion beam having ion trajectories which diverge from a scan origin 64. Scanner 60 may include spaced-apart scan plates 66 and 68. Ion beam 4 may be deflected in accordance with the electric field between scan plates 66 and 68. Angle corrector 62 is designed to deflect ions in scanned ion beam 4 to have parallel ion trajectories, i.e., to focus scanned ion beam 4. In one embodiment, angle corrector 62 may include magnetic pole pieces 72 that are spaced apart to define a gap, and a magnetic coil 74. Scanned ion beam 4 passes through the gap between pole pieces 72 and is deflected in accordance with a magnetic field in the gap. The magnetic field may be adjusted by varying the current through magnetic coil 74.

An electromagnet 110 (FIG. 4), according to various embodiments of the invention, may be implemented within ion implanter system 10 in a number of ways. For example, electromagnet 110 (FIG. 4) may be employed as an angle corrector 62 magnet.

Ion implanter system 10 may be attached to a computer system 100 used to control the various components of the system.

Figure 3B:
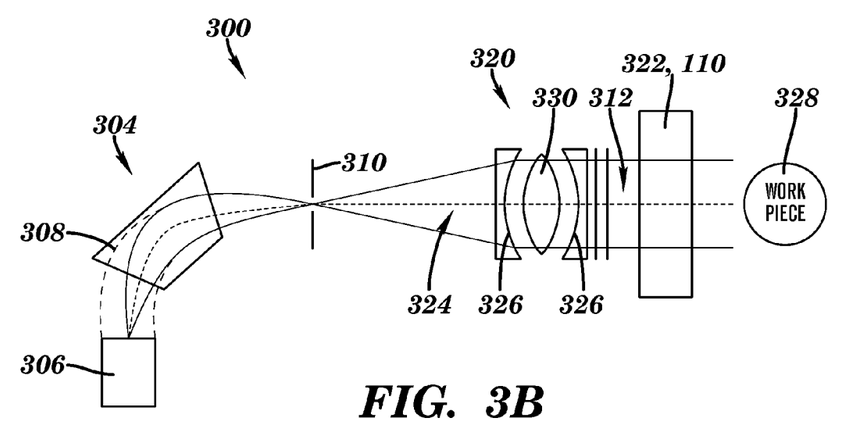
FIG. 3B shows a top view of another illustrative ion implanter system according to one embodiment of the invention.

Referring to FIG. 3B, a top view of another illustrative ion implanter system 300, this time in the form of a ribbon ion beam ion implanter system, according to one embodiment of the invention is shown. Ion implanter system 300 includes a ribbon ion beam generator 304, which may include, for example, an ion source 306, a mass analyzer magnet 308, and a mass resolving aperture 310. Ion implanter system 300 may be a high current system, e.g., delivering an ion beam with over ten milli-Amps (mA). As indicated, the initial ion beam may be generated using conventional narrow slit extraction-point-to-point optics (diverging solid line) or long slit extraction-parallel-to-point optics (parallel dashed line). In any event, mass analyzer magnet 308 refines the initial ion beam. It should be recognized that the above-described ribbon ion beam generator 304 is only illustrative and that other systems may be employed within the scope of the invention. Ion implanter system 300 may further include an acceleration/deceleration parallelizing lens system 320 and an energy filter system 322. Acceleration/deceleration parallelizing lens system 320 (hereinafter "lens system 320") receives a fanned ribbon ion beam 324, i.e., from ribbon ion beam generator 304 and, in particular, mass resolving aperture 310. Fanned ribbon ion beam 324 may expand to, for example, approximately 35 cm. The term "ribbon" indicates that the ion beam is substantially elongated in a lateral direction. Lens system 320 at least parallelizes fanned ribbon ion beam 324 into a substantially parallel ribbon ion beam 312, and may also accelerate or decelerate ribbon ion beam 324. Lens system 320 may include a set of curved electrostatic plates 326 for parallelizing and perhaps accelerating or decelerating fanned ribbon ion beam 324 and a set of acceleration/deceleration lenses 330 for accelerating or decelerating substantially parallel ribbon ion beam 312. Note that because mass resolving aperture 310 provides a fanned ribbon beam 324 that is uniform in height at the set of curved electrostatic plates 326, the slots of these plates (lenses) 326 are required to be of uniform width. Energy filter system 322, downstream from lens system 320, removes energy contamination prior to a work piece 328 to be implanted by substantially parallel ribbon ion beam 312. An electromagnet 110, according to various embodiments of the invention, may be implemented within energy filter system 322.

Figure 3C:
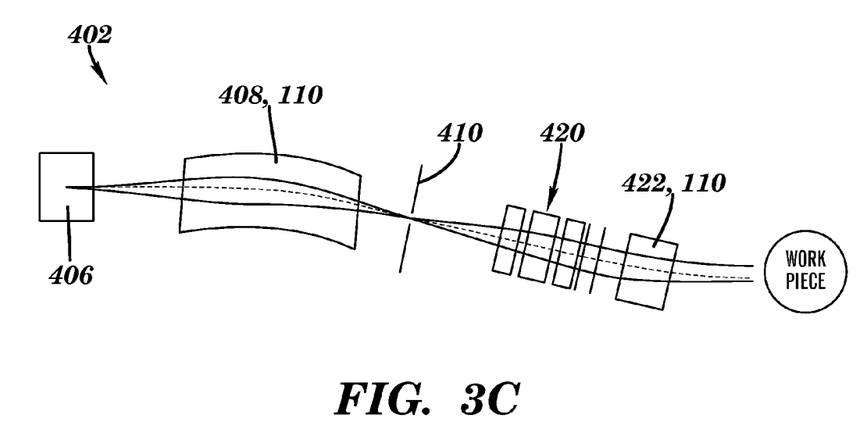
FIG. 3C shows a side view of an illustrative ion implanter system according to one embodiment of the invention.

FIG. 3C shows a side view of another ribbon ion implanter system 402 similar to that shown in FIG. 3B, except that system 402 uses an electromagnet 110 as part of a mass analyzer magnet 408 and as an energy filter system 422. System 402 also includes an ion source 406, a mass resolving aperture 410 and an acceleration/deceleration parallelizing lens system 420, as described above. Mass analyzer magnet 408 may include an electromagnet 110, as shown in and described relative to, for example, FIG. 11 below.

Although illustrative ion implanter systems have been illustrated above, it should be understood by those skilled in the art that any now known or later developed system to generate and scan an ion beam may be used for the current invention. Since operation of each of the above-described ion implanter systems is well known in the art, description of those processes is not necessary for the understanding of the current invention. However, it should be understood that the current invention may be used with any now known or later developed process and methods of ion implantation. For brevity, only the FIG. 3A embodiment will be referenced below unless otherwise necessary.

Figure 4:
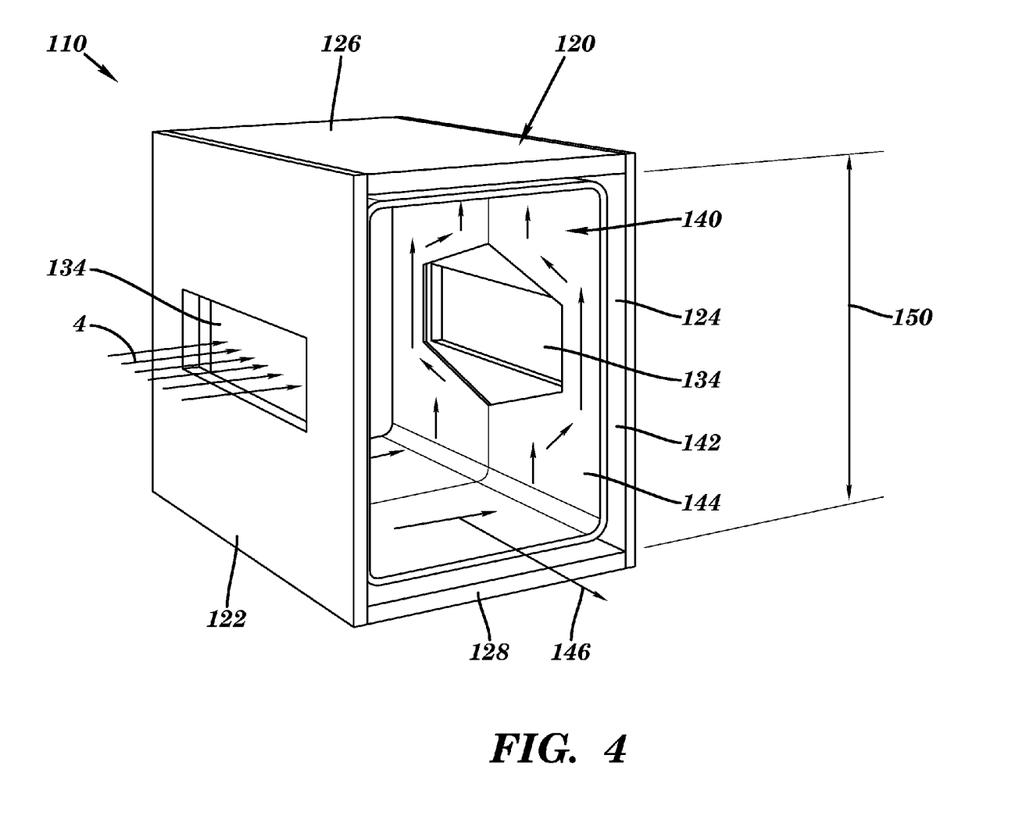
FIG. 4 shows a perspective view of one embodiment of an electromagnet including active field containment according to the invention.
Figure 5:
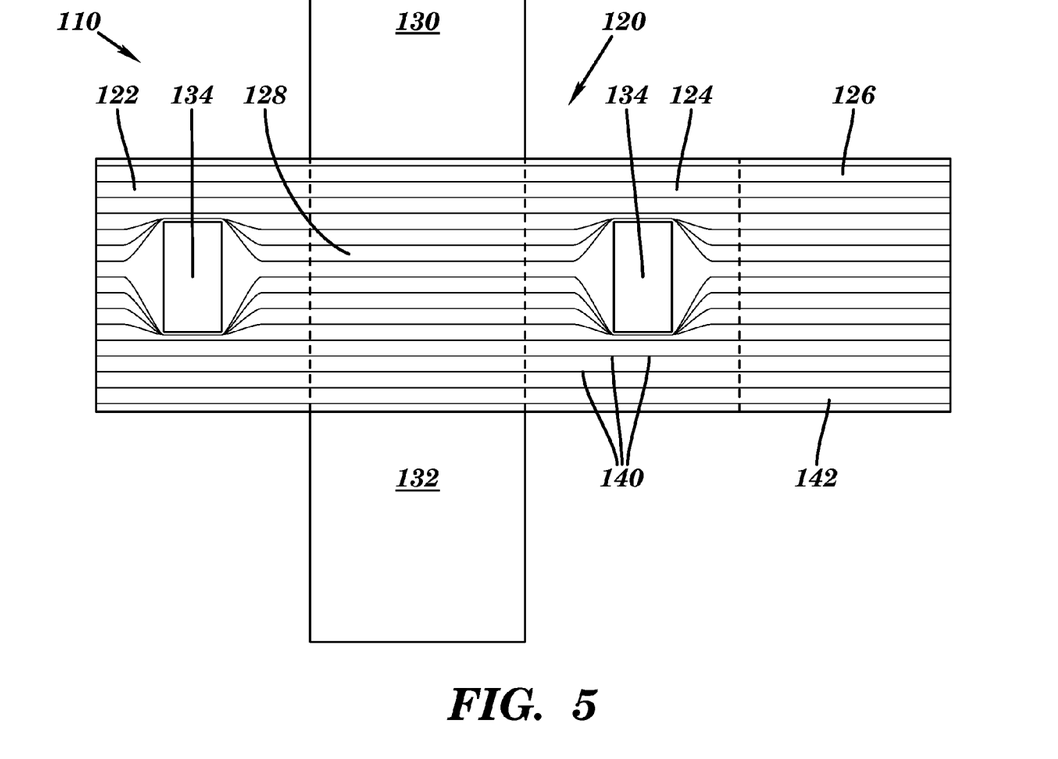
FIG. 5 shows an exploded view of the electromagnet of FIG. 4.

III. Electromagnet with Active Field Containment:

Referring to FIGS. 4-5, one embodiment of an electromagnet 110 with active field containment for modifying an ion beam will now be described. FIG. 4 shows a perspective view of one embodiment of electromagnet 110 with a side removed for clarity, and FIG. 5 shows an exploded view of electromagnet 110. Electromagnet 110 includes a box structure 120 including six sides made of a ferromagnetic material, e.g., steel. As such, box structure 120 includes a first side 122, a second opposing side 124, a third side 126 and a fourth opposing side 128, a fifth side 130 (FIG. 5 only) and a sixth opposing side 132 (FIG. 5 only). "Opposing side," as used herein, means generally opposite, but not necessarily any particular angular position such as parallel. It should be recognized that second, fourth and sixth sides 124, 128 and 132 are referred to as "opposing side" for reference purposes only and that each side can logically be referred to as opposing a corresponding side. Each of first side 120 and second opposing side 122 includes an opening 134 so as to form a window in box structure 120 for passage of ion beam 4 therethrough. Hence, electromagnet 110 may be referred to as a "window-frame electromagnet."

As shown best in FIG. 5, a plurality of current-carrying wires 140 (hereinafter "wires") are positioned within box structure 120 so as to have a path along an inner surface 142 of box structure 120. Inner surface 142 includes first side 122 and second opposing side 124 and third side 126 and fourth opposing side 128 so as to form a loop of current 144 (FIG. 4). Although shown as individual wires, one with skill in the art will recognize that wires 140 may actually be a single wound wire. In one embodiment, wires 140 are substantially uniformly distributed along inner surface 142. However, other arrangements may be used to accommodate special ion beam 4 modifications, if desired. In one embodiment, wires 140 can be layered, e.g., as five layers of one quarter inch (¼") hollow core copper wires. As shown in FIG. 5, wires 140 are positioned to pass around each opening 134 of first side 122 and second opposing side 124. FIG. 4 shows the flow of current via arrows.

In operation, as current flows through wires 140 (as shown by arrows in FIG. 4), an electromagnetic field is formed, with fifth side 130 and sixth opposing side 132 acting as magnetic poles. Magnetic flux 146 flows in the direction shown by arrow in FIG. 4. The current in wires 140 cancels the perpendicular fields caused by the steel sides (see distortions C in FIG. 2) and returns the currents from third side 126 to fourth opposing side 128 while still allowing a wide opening 134 (FIG. 4) for ion beam 4. This is in contrast to conventional systems in which the steel sides are absent, and current is returned outside the box to maintain the return current as far away from ion beam 4 as possible. In the conventional case, a steel clamp must be used outside the magnet end to clamp the fringing fields, which shunts and distorts the dipole field. Currents for electromagnet 110, however, are instead returned within box structure 120, against sides 122, 124, which function as energy or field containment walls. In the ideal limit, these currents would cover first side 122 and second opposing side 124 uniformly, yielding a perfect dipole field within box structure 120 and zero field outside. However, in order to create openings 134 for ion beam 4 within sides 122, 124, wires 140 are routed around openings 134, which then requires doubling up on current to the sides of opening 134 (see merged lines in FIG. 5 near openings 134). Although this perturbs the ideal situation, a high dipole field is still obtained inside, falling off to zero outside within a length on the order of the height of opening 134, rather than the pole separation. That is, electromagnet 110 provides active field containment and allows for a dipole box that is as high as desired without degrading the field observed by ion beam 4. In the illustrative electromagnet 110 of FIG. 4, the height may be approximately 40 cm. Electromagnet 110 also returns magnetic flux uniformly over first, second, third and fourth sides 122, 124, 126, 128. As a result, better management of the steel saturation problem can be attained by avoiding the large flux that gets returned in field clamps with conventional systems.

Figure 6:
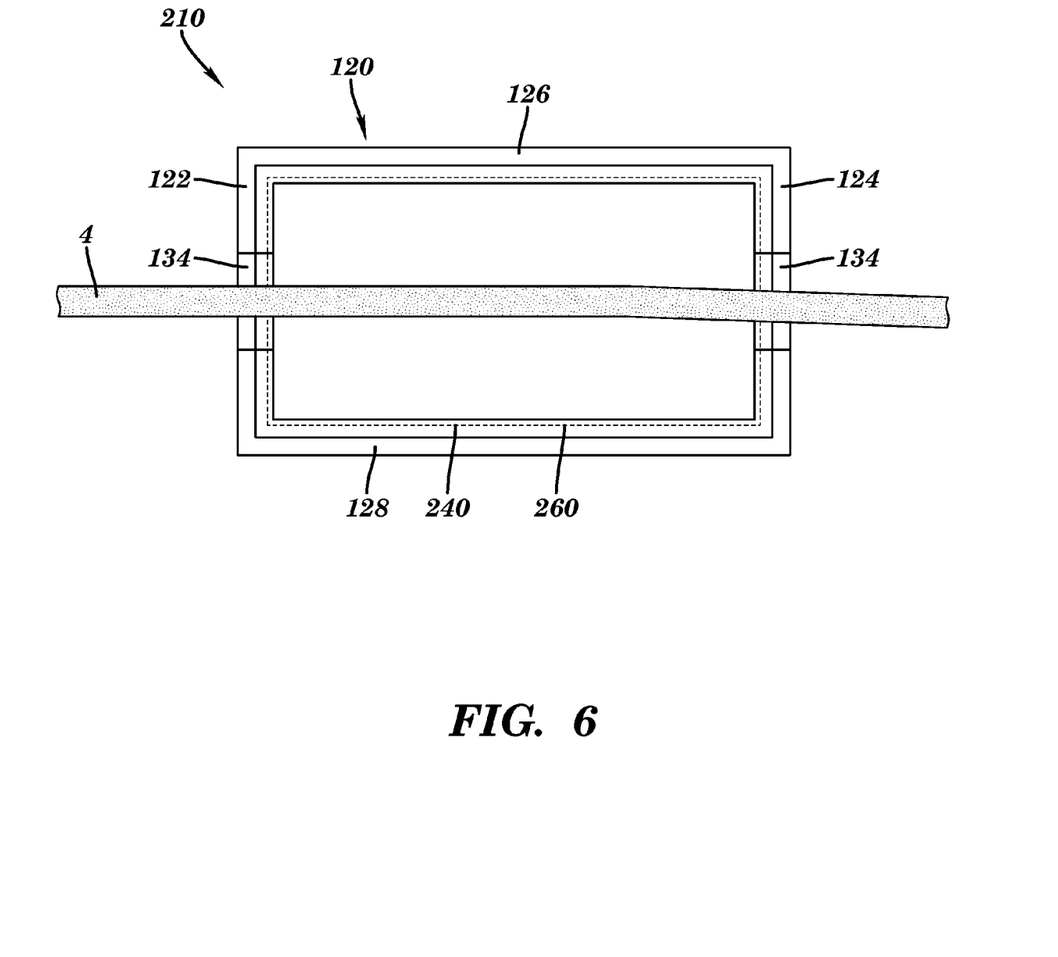
FIG. 6 shows a side cross-sectional view of an alternative embodiment of the electromagnet of FIG. 4.

Turning to FIGS. 6-13, various alternative embodiments of electromagnet 110 will now be described. Turning to FIG. 6, the electromagnet also allows the use of larger current densities without saturating the steel, making the possibility of a high temperature superconductor (HTS) electromagnet 210 more practical. As such, in one alternative embodiment, a plurality of current-carrying wires 240 (dashed line) may include high temperature superconducting (HTS) material. In this case, a cryostat 260 is coupled to wires 240. Cryostat 260 encloses only HTS wire 240 (not ferromagnetic material of box structure 120) and may be positioned with the interior of electromagnet 210.

Figure 7:
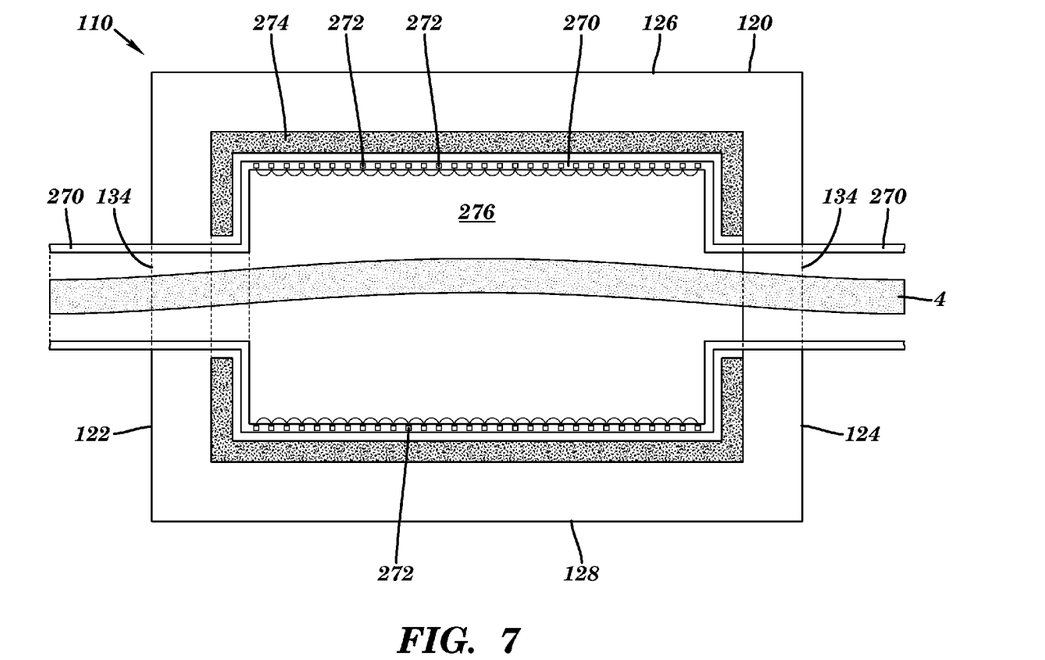
FIG. 7 shows a side cross-sectional view of another alternative embodiment of the electromagnet of FIG. 4.
Figure 8:
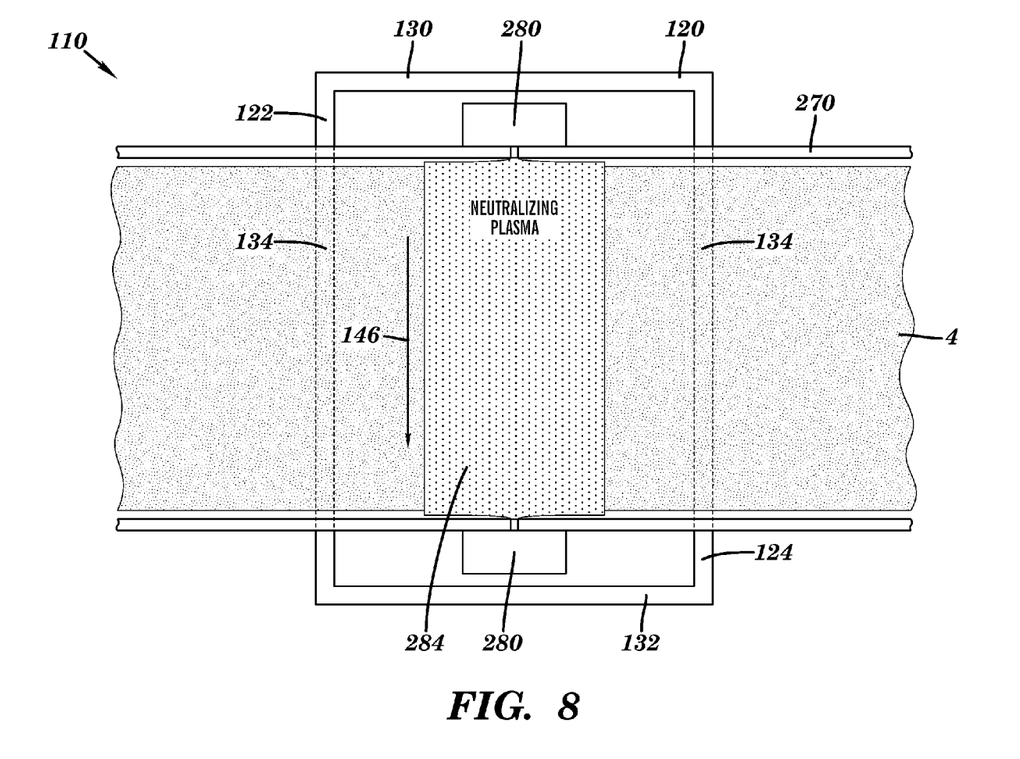
FIG. 8 shows a top cross-sectional view of another alternative embodiment of the electromagnet of FIG. 4.

Referring to FIGS. 7-8, the above-described electromagnet structure allows for provision of a number of additional structures within electromagnet 110. For example, as shown in the side view of FIG. 7, a tall beam guide box 270 may be positioned within box structure 120 of electromagnet 110. Beam guide box 270 may be made of a material that is unaffected by the magnetic flux, e.g., aluminum. Beam guide box 270 may accommodate beam plasma enhancement features such as multiple cusp magnets 272 positioned on each side of beam guide box 270 distanced from ion beam 4. Coils 274 surround beam guide box 270 within box structure 120. A vacuum 276 may be present within beam guide box 270. In another example, as shown in a top view of FIG. 8, at least one plasma source 280 may also be positioned within electromagnet 110, e.g., one adjacent each magnetic pole (fifth and sixth side 130, 132 (FIG. 5)), to introduce a neutralizing plasma 284. In one embodiment, a plasma source 280 may be implemented as a hot filament DC discharge, or in another as an RF inductive discharge. Plasma source(s) 280 can use magnetic flux 146 to transport electrons through ion beam 4. A beam guide box 270 may also be provided in this embodiment.

Figure 9A:
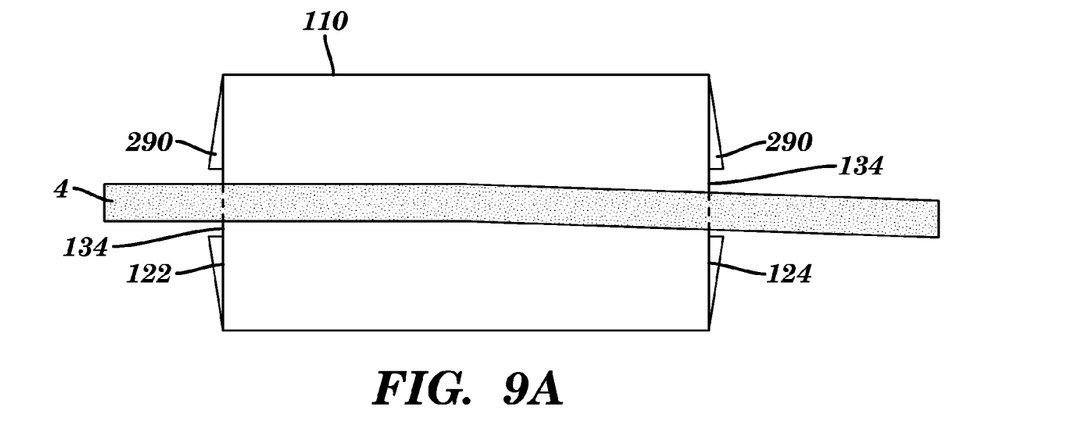
FIGS. 9A-9B show a side view and a top view, respectively, of another alternative embodiment of the electromagnet of FIG. 4.
Figure 9B:
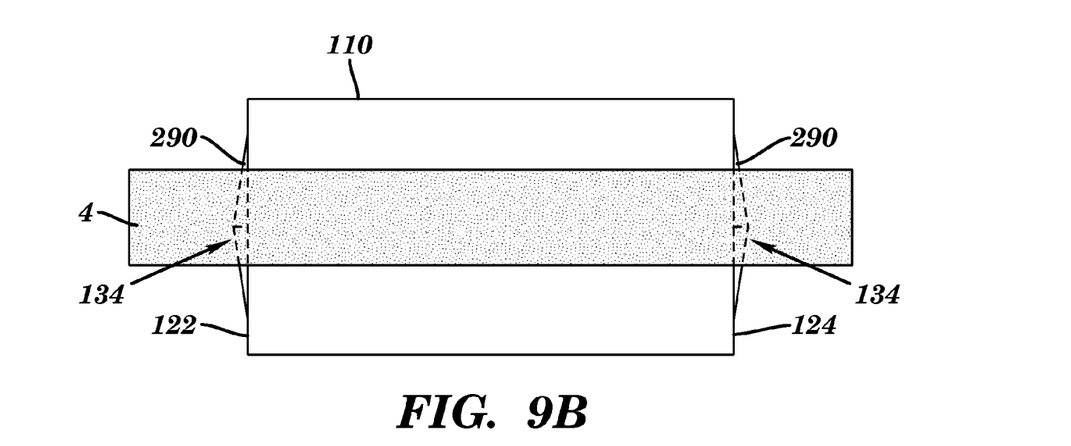
Figure 10:
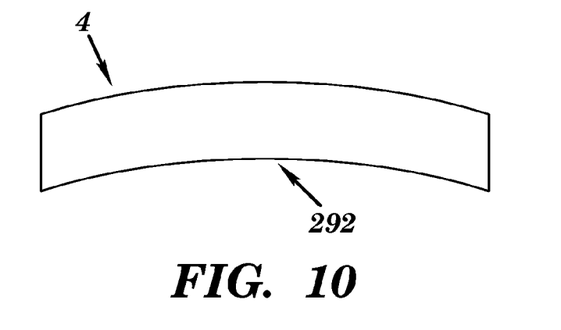
FIG. 10 shows a laterally bowed ion beam.

As shown in FIGS. 9A-B, according to another alternative embodiment, each of first side 122 and second opposing side 124 may have a substantially convex outer surface 290 adjacent to a respective opening 134. The disturbance of opening 134 on the dipole field causes ions at the edge of ion beam 4 to bend more than those at the center, causing ion beam 4 cross-section to be shaped as shown by curvature 292 in FIG. 10. Convex outer surfaces 290 compensate for this distortion by removing the bow in ion beam 4. Although, outer surfaces 290 are shown as linear surfaces, they can be stepped or curvilinear or any other shape that allows for gradual increasing of material progressing towards a center of a respective opening 134.

Figure 11:
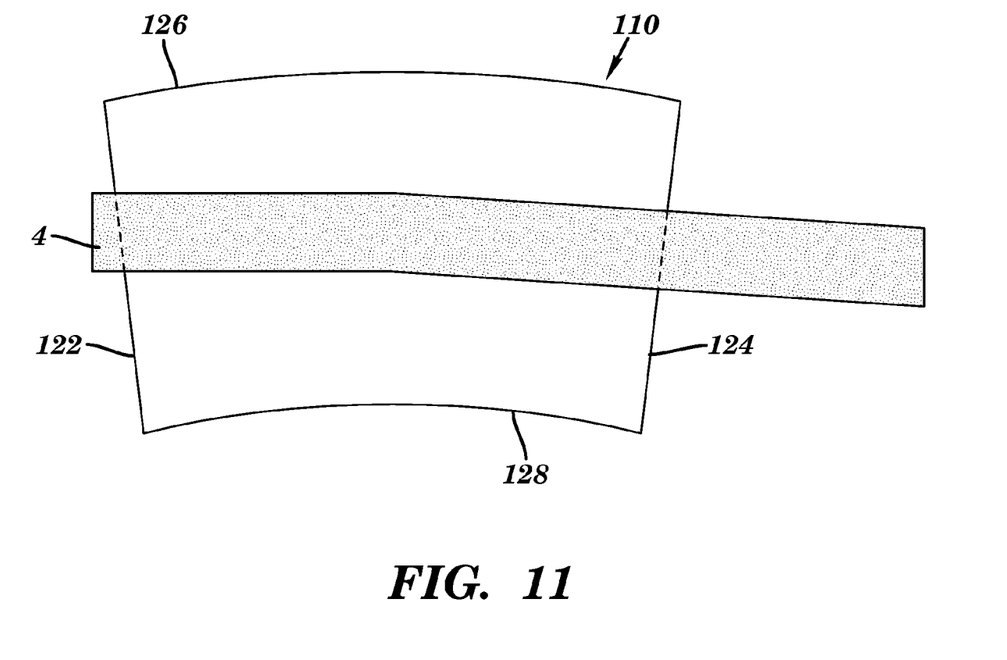
FIG. 11 shows a side view of another alternative embodiment of the electromagnet of FIG. 4.

Referring to the side view of FIG. 11, in another alternative embodiment, first side 122 and second opposing side 124 are angled in a non-parallel fashion relative to one another to accommodate the bend in ion beam 4. As also shown in FIG. 11, third and fourth sides 126, 128 may be shaped to substantially correspond to a path of ion beam 4 through electromagnet 110. For example, third and fourth sides 126, 128 may be angled or curved, depending on the path of ion beam 4.

Figure 12:
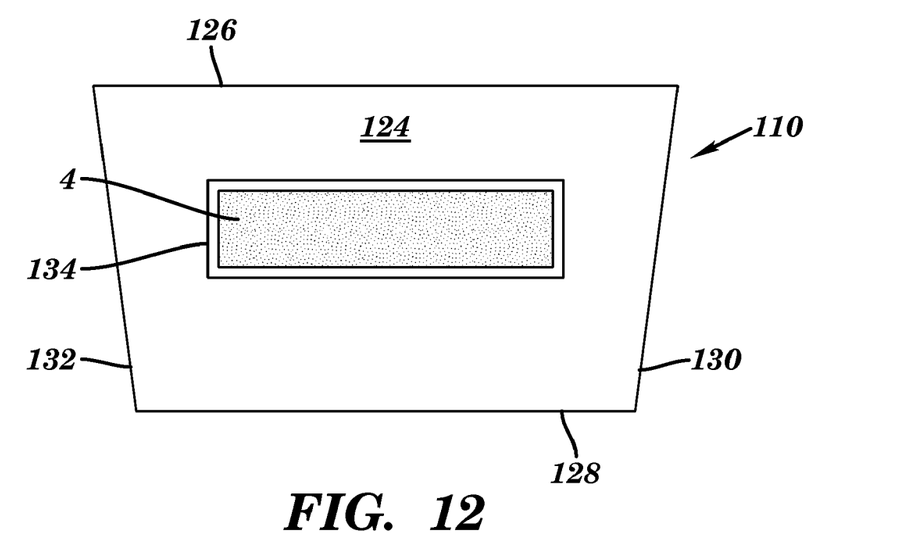
FIG. 12 shows an end view of another alternative embodiment of the electromagnet of FIG. 4.
Figure 13:
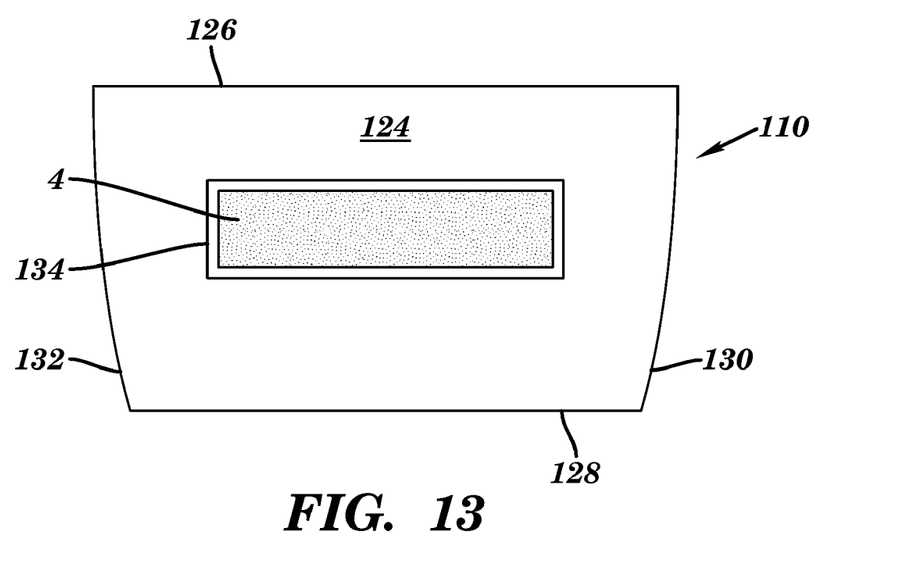
FIG. 13 shows an end view of another alternative embodiment of the electromagnet of FIG. 4.

Turning to the end view of FIG. 12, in another alternative embodiment, fifth side 130 and sixth opposing side 132 may be altered to provide different effects on ion beam 4. For example, fifth side 130 and sixth opposing side 132 may be angled in a non-parallel fashion relative to one another to allow vertical focusing, also known as effective indexing. In this case, fifth side 130 and sixth opposing side 132 act as pole shims. In this fashion, the angling creates a gradient magnetic field so as to create a focusing effect. In addition, or alternatively, as shown in the end view of FIG. 13, at least one of fifth side 130 and sixth opposing side 132 may include at least a portion that is curved to compensate for, or correct, aberrations in the magnetic field caused by openings 134 in first side 122 and second opposing side 124.

The above-described alternative embodiments may be used individually or in any combination desired.

IV. Applications:

The above-described embodiments of an electromagnet may be employed in a variety of different locations within ion implanter system, and in other systems for generating and focusing a charged particle beam. In one embodiment, the electromagnet may be employed as an energy contamination filtering system 112 (FIG. 3A), 322 (FIG. 3B), 422 (FIG. 3C) after a final acceleration/deceleration column 114 (FIG. 3A), 320 (FIG. 3B), 420 (FIG. 3C) of an ion implanter system. In another embodiment, the electromagnet may be employed as a mass analysis magnet such as used in mass analyzer 50 (FIG. 3A), 308 (FIG. 3B), 408 (FIG. 3C).

V. Conclusion:

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. An electromagnet for modifying an ion beam, the electromagnet comprising:
   a ferromagnetic box structure including a plurality of sides, each side having an outer surface and an inner surface opposite to the outer surface;
   an opening in each of a first side and a second opposing side of the plurality of sides of the ferromagnetic box structure for passage of the ion beam therethrough; and
   a plurality of current-carrying wires being disposed on the inner surface of the first and second opposing sides and having a first portion substantially parallel to a path of the ion beam and a second portion positioned to pass around each of the openings, wherein the plurality of current-carrying wires are absent from the outer surface of the first and second opposing sides of the ferromagnetic box structure.

2. The electromagnet of claim 1, wherein the ferromagnetic box structure is made of a material including a steel.

3. The electromagnet of claim 1, wherein the plurality of wires are substantially uniformly distributed along the inner surface.

4. The electromagnet of claim 1, further comprising a beam guide box positioned within the ferromagnetic box structure, each side of the beam guide box including a multiple cusp magnet.

5. The electromagnet of claim 1, wherein the plurality of wires include high temperature superconducting (HTS) material, and further comprising a cryostat coupled to the plurality of wires.

6. The electromagnet of claim 1, wherein each of the first side and the second opposing side has a substantially convex outer surface adjacent to a respective opening.

7. The electromagnet of claim 1, wherein the first side and the second opposing side are angled in a non-parallel fashion relative to one another.

8. The electromagnet of claim 1, wherein a fifth side and a sixth opposing side have a shape substantially corresponding to a path of the ion beam through the electromagnet.

9. The electromagnet of claim 1, further comprising at least one plasma source within the ferromagnetic box structure.

10. The electromagnet of claim 1, wherein the plurality of wires are layered.

11. An ion implanter system comprising:
an ion beam generator; and
an electromagnet including:
a ferromagnetic box structure including six sides, each side having an outer surface and an inner surface opposite to the outer surface;
an opening in each of a first side and a second opposing side of the ferromagnetic box structure for passage of an ion beam therethrough; and
a third side and an fourth opposing side of the ferromagnetic box structure each disposed on the first side and the second opposing side; and
at least two current-carrying wires being disposed on inner surfaces of the first side, the second opposing side, the third side, and the fourth opposing side of the ferromagnetic box structure and being spaced apart from one another by varying distances, wherein the current-carrying wires are configured to generate an electromagnetic field and wherein the current-carrying wires are absent from the outer surface of the first side and second opposing side and the third side and fourth opposing side of the ferromagnetic box structure.

12. The ion implanter system of claim 11, wherein the ferromagnetic box structure is made of a material including a steel.

13. The ion implanter system of claim 11, further comprising a beam guide box positioned within the ferromagnetic box structure, each side of the beam guide box including a multiple cusp magnet.

14. The ion implanter system of claim 11, wherein the at least two current-carrying wires include high temperature superconducting (HTS) material, and further comprising a cryostat coupled to the at least two current-carrying wires.

15. The ion implanter system of claim 11, wherein each of the first side and the second opposing side has a substantially convex outer surface adjacent to a respective opening.

16. The ion implanter system of claim 11, wherein the first side and the second opposing side are angled in a non-parallel fashion relative to one another.

17. The ion implanter system of claim 11, wherein the first side and the second opposing side have a shape substantially corresponding to a path of the ion beam through the electromagnet.

18. The ion implanter system of claim 11, further comprising at least one plasma source within the ferromagnetic box structure.

19. The ion implanter system of claim 11, wherein the at least two current-carrying wires are layered.

20. The electromagnet of claim 1, wherein the inner surfaces of the first side, the second opposing side, a third side, and a fourth opposing side of the ferromagnetic box structure form a loop of current, and wherein a fifth side and a sixth side opposing the fifth side of the ferromagnetic box structure form magnetic poles of the electromagnet.

21. The electromagnet of claim 20, wherein the fifth side and the sixth opposing side are angled in a non-parallel fashion relative to one another.

22. The electromagnet of claim 20, wherein at least one of the fifth side and the sixth opposing side includes at least a portion that is curved.

23. The ion implanter system of claim 11, wherein the inner surfaces of the first side, the second opposing side, a third side, and a fourth opposing side of the ferromagnetic box structure form a loop of current, and wherein a fifth side and a sixth opposing side form magnetic poles of the electromagnet.

24. The ion implanter system of claim 23, wherein the fifth side and the sixth opposing side are angled in a non-parallel fashion relative to one another.

25. The ion implanter system of claim 23, wherein at least one of the fifth side and the sixth opposing side include at least a portion that is curved.

* * * * *